United States Patent
Nomura et al.

(10) Patent No.: US 11,223,238 B2
(45) Date of Patent: *Jan. 11, 2022

(54) NON-CONTACT POWER FEEDING DEVICE

(71) Applicant: FUJI CORPORATION, Chiryu (JP)

(72) Inventors: Takeshi Nomura, Chiryu (JP); Shinji Takikawa, Nagoya (JP); Masayuki Oki, Kosai (JP)

(73) Assignee: FUJI CORPORATION, Chiryu (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/897,898

(22) Filed: Jun. 10, 2020

(65) Prior Publication Data

US 2020/0303962 A1 Sep. 24, 2020

Related U.S. Application Data

(63) Continuation of application No. 15/753,204, filed as application No. PCT/JP2015/076694 on Sep. 18, 2015.

(51) Int. Cl.
| | | |
|---|---|---|
| *H02J 50/12* | (2016.01) | |
| *B60M 7/00* | (2006.01) | |
| *B60L 5/00* | (2006.01) | |
| *B60L 5/36* | (2006.01) | |

(Continued)

(52) U.S. Cl.
CPC ............. *H02J 50/12* (2016.02); *B60L 5/00* (2013.01); *B60L 5/005* (2013.01); *B60L 5/36* (2013.01);
(Continued)

(58) Field of Classification Search
CPC .................................. H02J 50/12; H02J 50/90
See application file for complete search history.

(56) References Cited

U.S. PATENT DOCUMENTS 5,469,036 A 11/1995 Eto
5,519,262 A * 5/1996 Wood .................. H02J 50/10
307/104

(Continued)

FOREIGN PATENT DOCUMENTS

| DE | 42 36 340 A1 | 5/1994 |
|---|---|---|
| EP | 2 894 762 A1 | 7/2015 |

(Continued)

OTHER PUBLICATIONS

International Search Report dated Dec. 1, 2015 in PCT/JP2015/076694 filed Sep. 18, 2015.

*Primary Examiner* — Daniel Kessie
(74) *Attorney, Agent, or Firm* — Oblon, McClelland, Maier & Neustadt, L.L.P.

(57) ABSTRACT

A non-contact power feeding device includes multiple power feeding elements that are disposed spatially separated from one another in a movement direction, an AC power supply that supplies AC power to the power feeding elements, multiple power receiving elements that are provided in a moving body and that receive AC power in a non-contact manner, and a power receiving circuit that converts the AC power received by the power receiving elements and that outputs to an electrical load. When a length of the power feeding elements in the movement direction is LT, a separation distance between the power feeding elements is DT, a length of the power receiving elements in the movement direction is LR, and a separation distance between the power receiving elements is DR, the relationship DT≤DR and the relationship (2×LR+DR)≤LT are satisfied.

19 Claims, 5 Drawing Sheets

(51) Int. Cl.
    *H01F 38/14*     (2006.01)
    *B60L 53/12*     (2019.01)
    *B60L 53/39*     (2019.01)
    *B60L 9/00*     (2019.01)
    *H02J 50/40*     (2016.01)
    *H02J 50/90*     (2016.01)
    *B60L 5/42*     (2006.01)
    *H05K 13/04*     (2006.01)
    *B65G 54/02*     (2006.01)

(52) U.S. Cl.
    CPC ............... *B60L 5/42* (2013.01); *B60L 9/00* (2013.01); *B60L 53/12* (2019.02); *B60L 53/39* (2019.02); *B60M 7/00* (2013.01); *H01F 38/14* (2013.01); *H02J 50/40* (2016.02); *H02J 50/90* (2016.02); *H05K 13/04* (2013.01); *B65G 54/02* (2013.01)

(56) References Cited

U.S. PATENT DOCUMENTS

| | | | |
|---|---|---|---|
| 8,686,684 B2 * | 4/2014 | Turner | H02J 50/20 320/108 |
| 2012/0031952 A1 | 2/2012 | Hattori et al. | |
| 2012/0112553 A1 * | 5/2012 | Stoner, Jr. | H02J 50/90 307/104 |
| 2013/0220756 A1 * | 8/2013 | Jindo | F16C 29/008 191/10 |
| 2014/0116831 A1 | 5/2014 | Woronowicz | |
| 2015/0249366 A1 | 9/2015 | Takikawa et al. | |

FOREIGN PATENT DOCUMENTS

| | | |
|---|---|---|
| JP | 9-93841 A | 4/1997 |
| JP | 2006-211804 A | 8/2006 |
| JP | 2009-284695 A | 12/2009 |
| JP | 2010-125974 A | 6/2010 |
| JP | 2011-167031 A | 8/2011 |
| JP | 2012-38755 A | 2/2012 |
| JP | 2014/038018 A1 | 3/2014 |
| JP | 2014-53984 A | 3/2014 |
| JP | 2014-90642 A | 5/2014 |
| JP | 2014-147160 A | 8/2014 |
| TW | 201507892 A | 3/2015 |
| WO | WO 2014/049750 A1 | 4/2014 |
| WO | WO 2015/053030 A1 | 4/2015 |

* cited by examiner

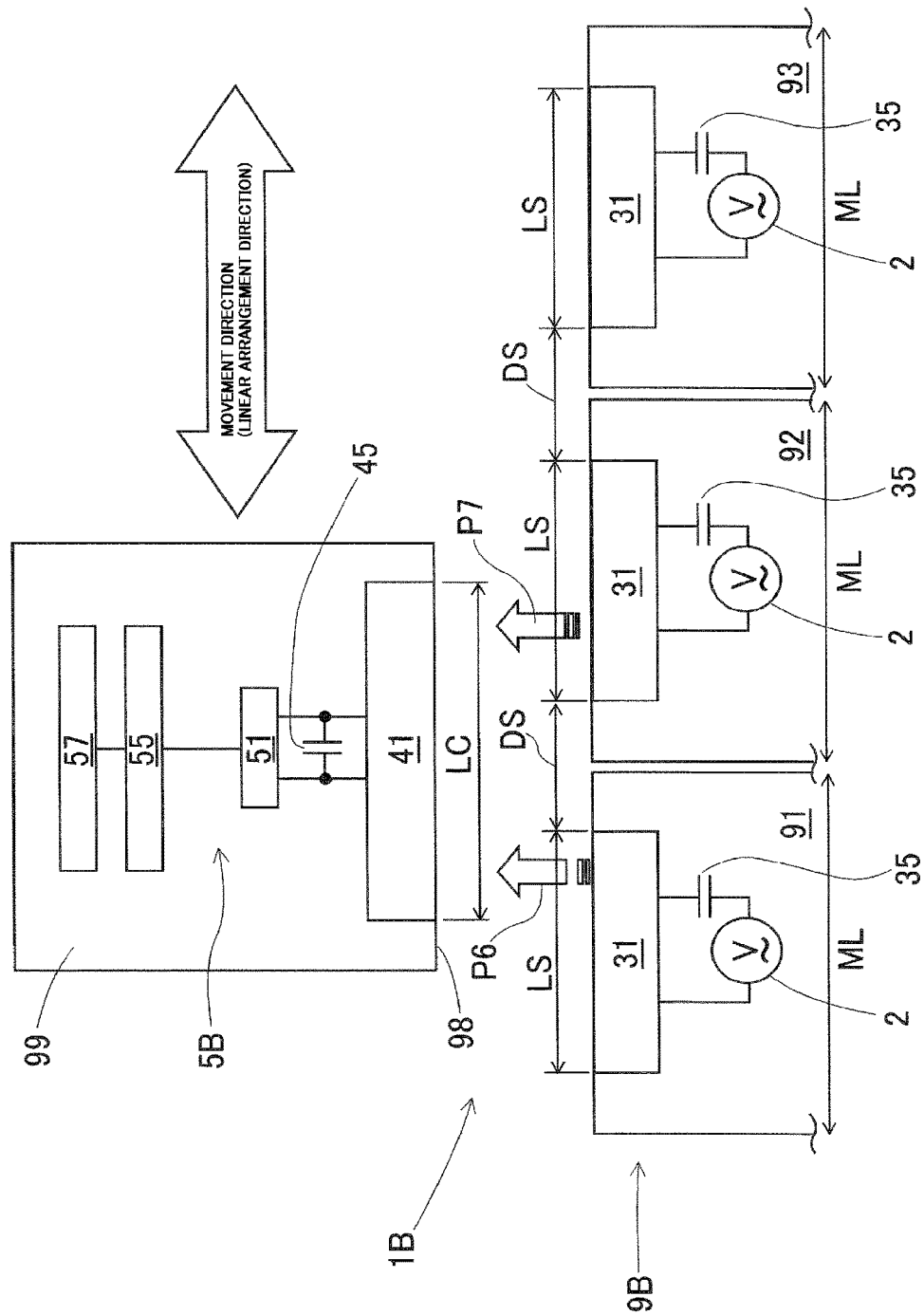

NON-CONTACT POWER FEEDING DEVICE

CROSS-REFERENCE TO RELATED APPLICATIONS

This application is a continuation of U.S. application Ser. No. 15/753,204, filed Feb. 16, 2018, which is a national stage of International Application No. PCT/JP2015/076694, filed Sep. 18, 2015. The above-identified applications are incorporated herein by reference in their entireties.

TECHNICAL FIELD

The present invention relates to a non-contact power feeding device that feeds power in a non-contact manner from a fixed section to a moving body, and, more specifically, relates to performance stabilization of non-contact power feeding.

BACKGROUND ART

A solder printing machine, a component mounting machine, a reflow machine, a board inspection machine, and the like, are examples of board production machines that produce boards on which multiple components are mounted. Generally, a board production line is configured by linking such equipment. Furthermore, there are many cases in which a board production line is configured by linearly arranging modularized board production machines of the same size. As a result of the use of modularized board production machines, setup changing work during rearrangement of a line and during expansion for increasing the size of a line is facilitated, and a flexible board production line is realized.

In recent years, the promotion of labor-saving efforts and automation by conveying the equipment and members used in each board production machine of a board production line to a moving body, which moves along the board production line, has been examined. Furthermore, non-contact power feeding devices have been considered as power feeding means to a moving body. Additionally, applications of non-contact power feeding devices are not limited to board production lines, and are present throughout a broad range of fields such as assembly lines and processing lines that produce other products, and power feeding during travel of an electrically driven vehicle. Technical examples relating to such non-contact power feeding devices are disclosed in PTLs 1 and 2.

The moving power feeding-type non-contact power feeding device of PTL 1 is a device that supplies power from a stationary power transmission coil to a moving power receiving coil in a non-contact manner. The power transmission coil has a looped form that is long in a movement direction and crossed in the middle to form multiple units whose magnetic fields are alternately reversed, and multiple power receiving coils are disposed at an interval. In addition, it is preferable that a size C of two power receiving coils in the movement direction and an interval d therebetween satisfy the inequality d≥C/2. Furthermore, it is preferable that a size L of a unit of a power transmission coil in the movement direction satisfy the inequality L≥C+d. As a result of this, the document indicates that the generation of a pulsing motion in which the received power is periodically momentarily zero is reliably prevented.

In addition, the system for non-contact power feeding system during traveling of PTL 2 is a system that feeds AC power in a non-contact manner from multiple primary-side power feeding transformers on a ground side to a secondary side power feeding transformer of a moving body, and the primary-side power feeding transformers and the secondary-side power feeding transformer are composed of double-sided winding coils. Further, when a dimension of the magnetic poles of the primary-side power feeding transformers is defined as D, a center-to-center distance of adjacent primary-side power feeding transformers does not exceed 3D. Furthermore, the document indicates an aspect in which the plurality of primary-side power feeding transformers are connected in series to a high-frequency power supply. The document indicates that, according to this configuration, even if the primary-side power feeding transformers are disposed in stepping stone form, interruption of the power feeding to the secondary-side power feeding transformer does not occur.

CITATION LIST

Patent Literature

PTL 1: JP-A-2014-53984
PTL 2: JP-A-2014-147160

SUMMARY OF INVENTION

Technical Problem

It should be noted that in the technique of PTL 1, a so-called "straddled power receiving state" time slot in which two power receiving coils both straddle a boundary of two units of power transmission coils can occur. In this time slot, since the magnetic fields of two units that are interlinked with the power receiving coils negate one another, the received power is reduced greatly without reaching zero, and a large pulsing motion can occur. If a large pulsing motion occurs in the received power, there is a concern that it will no longer be possible to drive an electrical load of the moving body side. In addition, since the entirety of the long looped form power transmission coil is charged at all times, an increase in the size of a power supply device and an increase in loss due to leakage flux are inevitable.

The above-mentioned problems of a reduction in the received power, an increase in the size of the power supply device and increased loss also apply to the technique of PTL 2. That is, there is a separation distance of 2D between adjacent primary-side power feeding transformers, and the received power is reduced and a pulsing motion occurs when the secondary-side power feeding transformer is moved in the region of the separation distance. In order to reduce the effect of the pulsing motion, a feature of using a power accumulating element (battery) and a charging circuit is disclosed in an embodiment of PTL 2. Such a configuration leads to an increase in the weight of the moving body, and therefore, the motive power required for movement is increased. In addition, if multiple primary-side power feeding transformers are connected in series to a high-frequency power supply, there is an increase in the size of the high-frequency power supply and there is an increase in the loss thereof.

The present invention has been devised in the light of the above-mentioned problems of the background art, and an object of the present invention is to provide a non-contact power feeding device capable of performing stable non-contact power feeding at all times by suppressing a pulsing motion in AC power that is received.

Solution to Problem

A non-contact power feeding device of the present invention that solves the above-mentioned problems is provided with a plurality of power feeding elements that are disposed spatially separated from one another in a movement direction set in a fixed section, an AC power supply that supplies AC power to the power feeding elements, a power receiving element that is provided in a moving body, which moves in the movement direction, that is electrically coupled to the power feeding elements that are positioned in an opposing manner, and that receives AC power in a non-contact manner, and a power receiving circuit that converts AC power received by the power receiving element, and that generates a drive voltage and outputs the drive voltage to an electrical load provided in the moving body, in which a plurality of the power receiving elements are disposed spatially separated from one another in the movement direction of the moving body, and when a length of the power feeding elements in the movement direction is defined as LT, a separation distance between the power feeding elements is defined as DT, a length of the power receiving elements in the movement direction is defined as LR, and a separation distance between the power receiving elements is defined as DR, the relationship DT≤DR and the relationship (2×LR+DR)≤LT are satisfied.

Advantageous Effects of Invention

In the non-contact power feeding device of the present invention, since the relationships of the two inequalities mentioned above are satisfied, at least anyone power receiving element directly faces a power feeding element at all times regardless of the position of the moving body. The term "directly face" signifies a positional relationship in which the entire length LR of a power receiving element in the movement direction is opposite a range of the length LT of a power feeding element in the movement direction. The power receiving element that directly faces a power feeding element gradually switches in accordance with movement of the moving body. At this time, the position of another power receiving element can change depending on a combination of the lengths LT and LR, and the separation distances DT and DR, and the position of the moving body. In other words, it is possible for the other power receiving element to directly face the same power feeding element as the one power receiving element, to directly face another power feeding element, to oppose two power feeding elements in a straddled manner, to oppose any one of the power feeding elements, or not to oppose any of the power feeding elements. The term "oppose" signifies a positional relationship in which a portion of the length LR of a power receiving element in the movement direction is opposite a range of the length LT of a power feeding element in the movement direction. Therefore, a favorable power receiving state is ensured and at least one power receiving element can receive a large amount of AC power at all times regardless of the position of the other power receiving element. As a result of this, a pulsing motion of the AC power received is suppressed, and it is possible to perform stable non-contact power feeding at all times.

BRIEF DESCRIPTION OF DRAWINGS

FIG. 5 is a view that schematically describes a configuration of a non-contact power feeding device of a third embodiment.

DESCRIPTION OF EMBODIMENTS (1. Configuration of Non-Contact Power Feeding Device 1 of First Embodiment)

Figure 1:
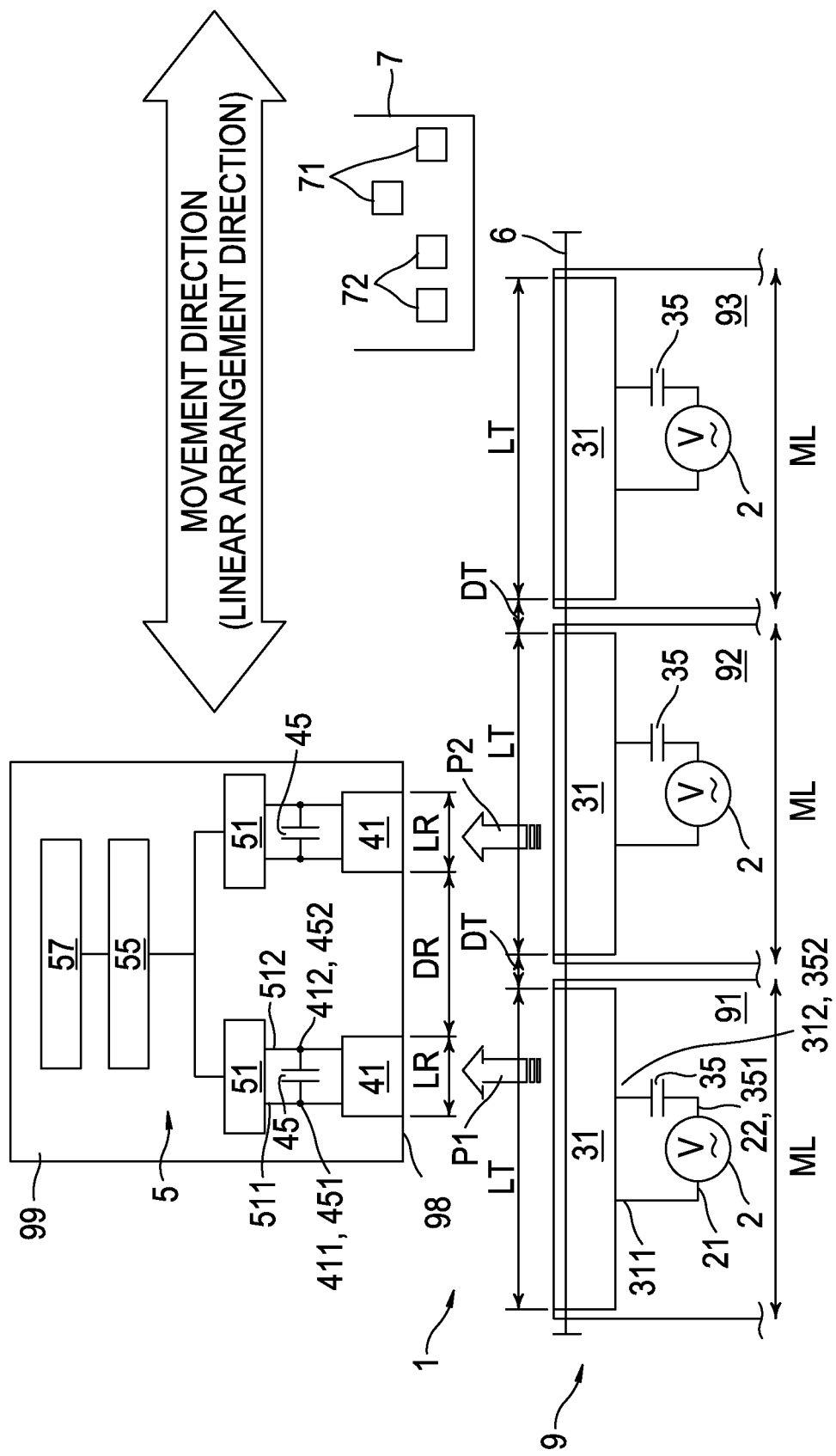
FIG. 1 is a view that schematically describes a configuration of a non-contact power feeding device of a first embodiment.

A non-contact power feeding device 1 of a first embodiment of the present invention will be described below with reference to FIGS. 1 to 3. FIG. 1 is a view that schematically describes a configuration of the non-contact power feeding device 1 of the first embodiment. The non-contact power feeding device 1 of the first embodiment is assembled on a board production line 9, which corresponds to a fixed section. As shown by FIG. 1, the board production line 9 is configured by three first to third board production machines 91, 92, and 93 being linearly arranged. The left-right direction in FIG. 1 is a linear arrangement direction of the first to third board production machines 91, 92, and 93, and is also a movement direction of a moving body 99, which will be mentioned later.

Each board production machine 91, 92, and 93 is modularized, and width dimensions ML in the linear arrangement direction thereof are equivalent. The first to third board production machines 91, 92, and 93 are configured so that alterations in the order of the linear arrangement positions and replacements with other modularized board production machines can be made. The number of linearly arranged board production machines that configure the board production line 9 may be four or more, and the board production line 9 is also compatible with module expansion for increasing the number of linearly arranged machines. Component mounting machines are can be included as illustrative examples of the first to third board production machines 91, 92, and 93, but the invention is not limited to this configuration.

A guide rail 6, which extends in the linear arrangement direction, is installed in front of the first to third board production machines 91, 92, and 93. The moving body 99 moves in the movement direction (the linear arrangement direction of the first to third board production machines 91, 92, and 93) along the guide rail. The moving body 99 has roles of carrying in equipment 71, members 72, and the like, that are used by each board production machine 91, 92, and 93 from a storage container 7 and returning equipment 71, members 72, and the like, to the storage container 7 after use.

The non-contact power feeding device 1 of the first embodiment is a device that performs non-contact power feeding to the moving body 99 from the first to third board production machines 91, 92, and 93. The non-contact power feeding device 1 is configured by AC power supplies 2, power feeding coils 31, and power feeding-side capacitors 35, which are respectively provided in the first to third board production machines 91, 92, and 93, as well as two power receiving coils 41, two power receiving-side capacitors 45, and a power receiving circuit 5, which are provided in the moving body 99, and the like.

The three board production machines 91, 92, and 93 and configurations of other modularized board production machines pertaining to the non-contact power feeding device 1 are identical, and therefore, from this point onwards, description will be given by assigning detailed reference symbols to the first board production machine 91. The AC power supply 2 generates an AC voltage and supplies the AC voltage to the power feeding coil 31. It is preferable that the frequency of the AC voltage by set as appropriate on the basis of a resonance frequency of a power feeding-side resonance circuit and a power receiving-side resonance circuit, which will be mentioned later. The total of three AC power supplies 2 provided in the three board production machines 91, 92, and 93 can be operated independently of one another.

For example, the AC power supply 2 can be configured using a DC power supply section that outputs a DC voltage and a publicly-known bridge circuit that AC converts the DC voltage. The AC power supply 2 includes a function of adjusting voltage value, frequency, phase, and the like. A first output terminal 21 of the AC power supply 2 is directly coupled with one end 311 of the power feeding coil 31, and a second output terminal 22 is connected to one end 351 of the power feeding-side capacitor 35.

The other end 352 of the power feeding-side capacitor 35 is connected to the other end 312 of the power feeding coil 31. As a result of this, a closed power feeding circuit is configured. The power feeding coil 31 is one form of a power feeding element. The power feeding coils 31 are provided on the front face of each board production machine 91, 92, and 93, and are configured in a symmetric shape at the front and back in a conveyance direction. The power feeding-side capacitor 35 is a resonance element that forms the power feeding-side resonance circuit by being connected in series to the power feeding coil 31.

The two power receiving coils 41 are installed, in the moving body 99, on a side face 98 that opposes the power feeding coils 31, and are disposed spatially separated from one another in the movement direction. The power receiving coil 41 and the power feeding coil 31 electromagnetically couple with one another, and non-contact power feeding is possible as a result of mutual inductance being generated. The power receiving coil 41 is one form of a power receiving element. One end 411 of the power receiving coil 41 is connected to one end 451 of the power receiving-side capacitor 45 and one terminal 511 on the input side of a rectifier circuit 51 that configures the power receiving circuit 5. The other end 412 of the power receiving coil 41 is connected to the other end 452 of the power receiving-side capacitor 45 and the other terminal 512 on the input side of the rectifier circuit 51. The power receiving-side capacitor 45 is a resonance element that forms a power receiving-side resonance circuit by being connected in parallel to the power receiving coil 41.

Figure 2:
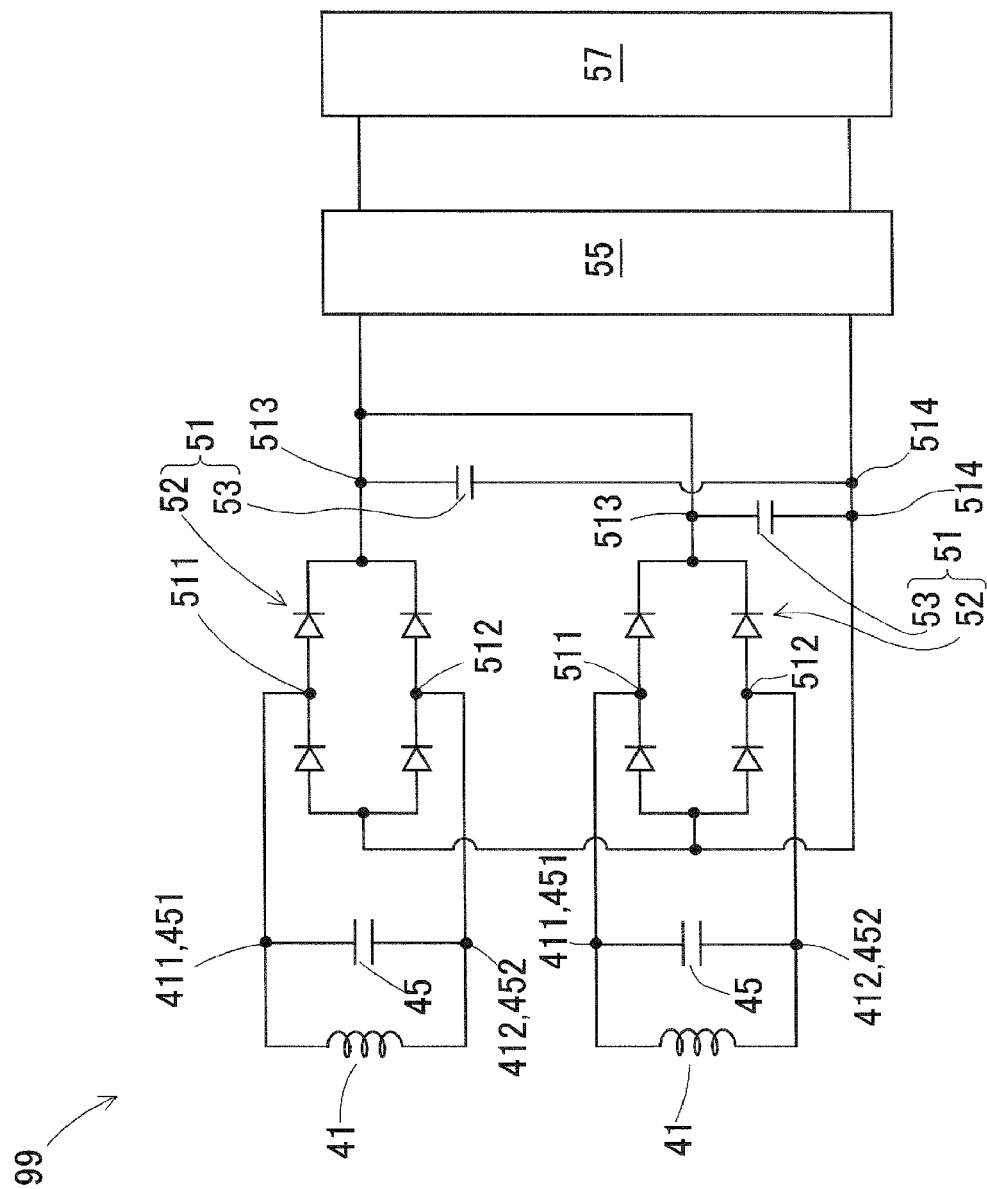
FIG. 2 is a circuit diagram that shows a detailed circuit configuration of a moving body side of the non-contact power feeding device.

FIG. 2 is a circuit diagram that shows a detailed circuit configuration of the moving body 99 of the non-contact power feeding device 1. As illustrated in the drawing, the power receiving circuit 5 is configured to include the rectifier circuits 51, which are provided individually for the two power receiving coils 41, and a DC power supply circuit 55, which is provided commonly to the two power receiving coils 41. The rectifier circuit 51 is configured by a full-wave rectifier circuit 52, which is bridge connected to four rectifier diodes, and a smoothing capacitor 53, which is connected to the output side of the full-wave rectifier circuit 52. One terminal 513 and another terminal 514 on the output sides of the two rectifier circuits 51 are connected in parallel to the DC power supply circuit 55. The two rectifier circuits 51 convert, into a DC voltage, AC power that the power receiving coil 41 connected to the respective input side thereof receives by non-contact power feeding, and output the DC voltage to the DC power supply circuit 55.

The DC power supply circuit 55 adjusts a DC voltage having an unstable voltage value, which is output from the rectifier circuits 51, to a DC drive voltage having a largely fixed voltage, and outputs the DC drive voltage to an electrical load 57 that is installed in the moving body 99. For example, the electrical load 57 may include a driving source for movement of the moving body 99, for example, a linear motor, or the like. A switching type or dropper type DC-DC converter are illustrative examples of the DC power supply circuit 55.

(2. Actions of Non-Contact Power Feeding Device 1 of First Embodiment)

Next, the magnitude relationships of the lengths of the power feeding coils 31 and the power receiving coils 41 in the movement direction and the separation distances between adjacent coils in the movement direction, and the actions achieved by said magnitude relationships will be described. As shown in FIG. 1, a length, in the movement direction, of the power feeding coils 31 on the board production line 9 side is defined as LT, and a separation distance between power feeding coils 31 is defined as DT. In addition, a length, in the movement direction, of the power receiving coils 41 on the moving body 99 side is defined as LR, and a separation distance between power receiving coils 41 is defined as DR. The length LT of the power feeding coils 31 in the movement direction is slightly less than the width dimension ML of the board production machines 91, 92, and 93.

In this instance, the relationship DT≤DR is satisfied. According to this relationship, a circumstance in which the two power receiving coils 41 on the moving body 99 side are opposite regions between the small separation distances DT on the board production line 9 side does not occur. Therefore, at least one of the two power receiving coils 41 is always outside the ranges of the separation distance DT and directly facing a power feeding coil 31. The term "directly face" signifies a positional relationship in which the entire length LR of a power receiving coil 41 in the movement direction is opposite a range of the length LT of a power feeding coil 31 in the movement direction.

In addition, the relationship (2×LR+DR)≤LT is satisfied. According to this relationship, a time slot, in which the entire lengths LR of two power receiving coils 41 in the movement direction oppose a range of the length LT of a single power feeding coil 31 in the movement direction occurs. In other words, there is a positional relationship in which two power receiving coils 41 each directly face a single power feeding coil 31 in accordance with movement of the moving body 99.

More specifically, in the positional relationship shown in FIG. 1, the power receiving coil 41 on the left side in the drawing directly faces the power feeding coil 31 of the first board production machine 91 and the power receiving coil 41 on the right side in the drawing directly faces the power feeding coil 31 of the second board production machine 92. In other words, there is a positional relationship in which one power receiving coil 41 directly faces one power feeding coil 31 and another power receiving coil 41 directly faces another power feeding coil 31. At this time, the two power receiving coils 41 are both in favorable power receiving states, and as shown by the arrows P1 and P2, it is possible to receive a large amount of AC power. Further, the AC power received by the two power receiving coils 41 is summed by the DC power supply circuit 55 after being rectified. As a result of this, a large amount of DC power, which is equivalent to the AC power received by the two power receiving coils 41, is supplied to the electrical load 57.

When the moving body 99 moves in the right direction from the positional relationship of FIG. 1, the power receiving coil 41 on the right side still directly faces the power feeding coil 31 of the second board production machine 92. In contrast to this, the power receiving coil 41 on the left side opposes the power feeding coil 31 of the first board production machine 91 in a state of deviating from the front face thereof. The term "oppose" signifies a positional relationship in which a portion of the length LR of a power receiving coil 41 in the movement direction is opposite a range of the length LT of a power feeding coil 31 in the movement direction. In a power receiving coil 41 in an opposing state, the AC power received decreases in conjunction with a decrease from a directly facing state in the opposing area that is opposite a power feeding coil 31.

Figure 3:
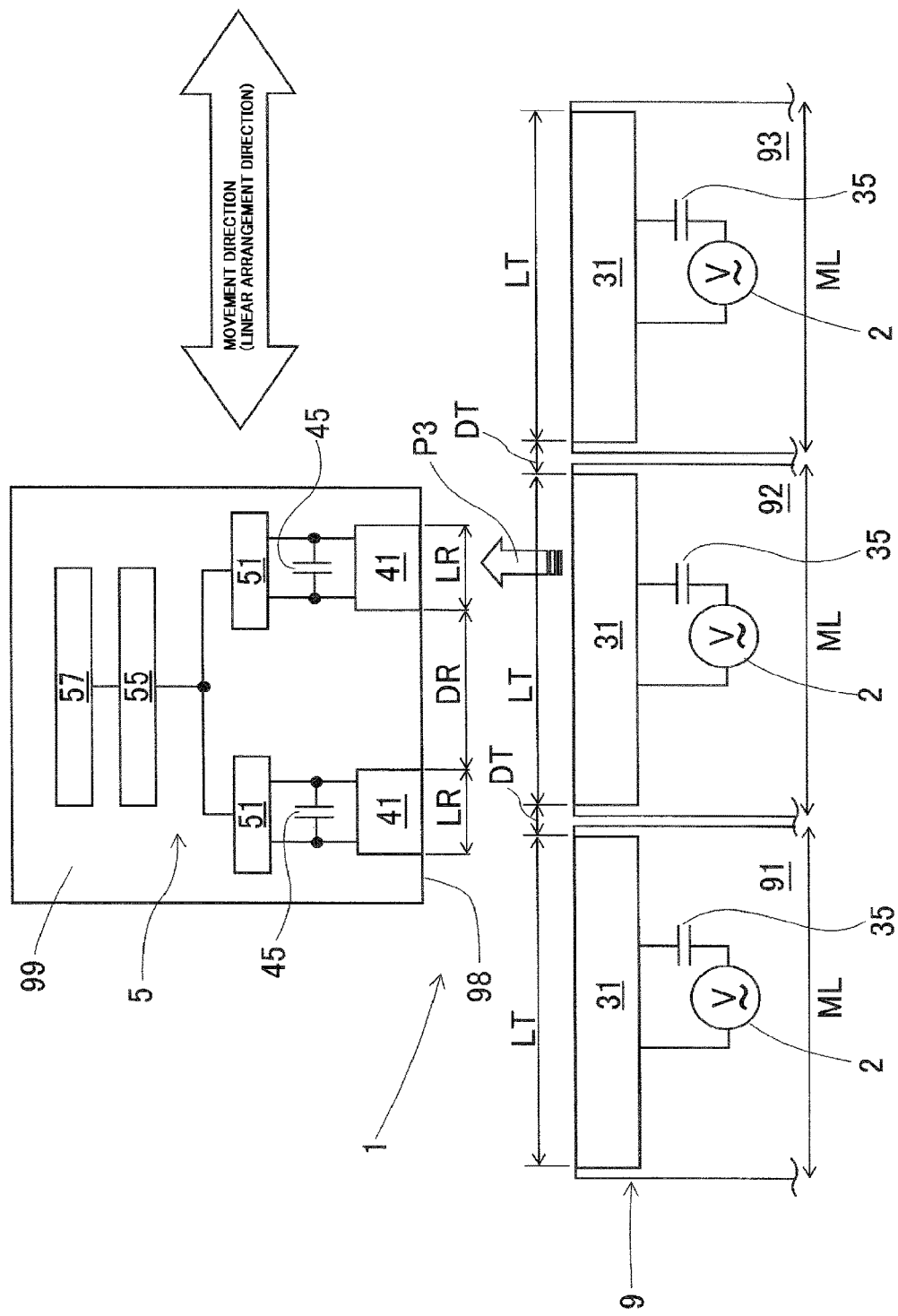
FIG. 3 is a view that illustrates by way of example, a positional relationship in which one of two power receiving coils directly faces a power feeding coil and the other is in a straddled power receiving state.

Furthermore, when the moving body 99 moves in the right direction, the positional relationship shown in FIG. 3 is attained. FIG. 3 is a view that illustrates by way of example, a positional relationship in which one of two power receiving coils 41 directly faces a power feeding coil 31 and the other is in a straddled power receiving state. In FIG. 3, the power receiving coil 41 on the right side directly faces the power feeding coil 31 of the second board production machine 92. The power receiving coil 41 on the left side is positioned between the first and second board production machines 91 and 92, and opposes two power feeding coils 31 in a straddled manner.

The extent of the AC power that the power receiving coil 41 in the straddled power receiving state receives is dependent on the positional relationship of the two opposing power feeding coils 31, and the frequency, phase, and the like, of the two AC power supplies 2. Accordingly, it is not considered that the power receiving coil 41 in a straddled power receiving state is in a favorable power receiving state. For example, if the two AC power supplies 2 have opposite phases in a similar manner to the technique of PTL 1, the actions of magnetic fluxes formed by the two power feeding coils 31 that face the power receiving coil 41 in a straddled power receiving state negate one another, and the power receiving state is reduced. If the frequencies and phases of the two AC power supplies 2 match, the power receiving state of the power receiving coil 41 in a straddled power receiving state is improved.

Meanwhile, the power receiving coil 41 on the right side in the drawing still directly faces the power feeding coil 31 of the second board production machine 92. Therefore, the power receiving coil 41 on the right side retains a favorable power receiving state, and as shown by the arrow P3, it is possible to receive a large amount of AC power. Accordingly, at the very least, the large amount of AC power received by the power receiving coil 41 on the right side in a favorable power receiving state is ensured.

When the moving body 99 moves further in the right direction from the positional relationship of FIG. 3, a positional relationship in which the two power receiving coils 41 directly face the power feeding coil 31 of the second board production machine 92 is attained. At this time, the two power receiving coils 41 are in a favorable power receiving state in which the magnetic flux induced by a single power feeding coil 31 is shared. Accordingly, a larger amount of AC power than that of: the positional relationship shown in FIG. 3 is ensured. When the moving body 99 moves still further in the right direction, on this occasion, the directly facing state of the power receiving coil 41 on the left side is retained, and the power receiving coil 41 on the right side changes from a directly facing state to an opposing state, or a straddled power receiving state. Thereafter, a positional relationship in which the power receiving coil 41 on the left side directly faces the power feeding coil 31 of the second board production machine 92, and the power receiving coil 41 on the right side directly faces the power feeding coil 31 of the third board production machine 93 is attained.

As can be understood from the above-mentioned positional relationships, in the first embodiment, the power receiving coil 41 that, directly faces a power feeding coil 31 gradually switches in accordance with movement of the moving body 99. Despite this, a favorable power receiving state in which at least any one of the power receiving coils 41 directly faces a power feeding coil 31 at all times is ensured.

In addition, even if alterations in the order of the linear arrangement positions of the first to third board production machines 91, 92, and 93 or replacements with other modularized board production machines are performed, the disposition on the board production line 9 side that is shown in FIG. 1 is retained. In other words, even if the line configuration of the board production line 9 is altered, the configuration of the non-contact power feeding device 1 is not altered and a favorable power receiving state is ensured. Furthermore, when the board production line 9 is made compatible with module expansion in which the number of linearly arranged machines is four or more, the length LT and the separation distance DT of the power feeding coil 31 are also identical values in an expanded portion. Accordingly, even when the board production line 9 is made compatible with module extension, a favorable power receiving state is ensured in the non-contact power feeding device 1.

In addition, the AC power supplies 2 are respectively provided in the three board production machines 91, 92, and 93, and can be operated independently of one another. Accordingly, the individual AC power supplies 2 can be low capacity and compact, and therefore, there are few restrictions on the spaces in which the board production machines 91, 92, and 93 are installed. Furthermore, it is possible to stop the AC power supply 2 in a board production machine that is separated from the moving body 99. For example, at the times of the positional relationships shown in FIGS. 1 and 3, it is possible to stop the AC power supply 2 in the third board production machine 93.

(3. Aspects and Effects of Non-Contact Power Feeding Device 1 of First Embodiment)

The non-contact power feeding device 1 of the first embodiment is provided with the multiple power feeding coils 31 (power feeding elements) that are disposed spatially separated from one another in a movement direction set in the board production line 9 (fixed section), the AC power supplies 2 that supply AC power to each power feeding coil 31, the power receiving coils 41 (power receiving elements) that are provided in the moving body 99, which moves in the movement direction, that are electrically coupled to the power feeding coils 31, and that receive AC power in a non-contact manner, and the power receiving circuit 5 that converts AC power received by the power receiving coils 41, and that generates a drive voltage and outputs the drive voltage to the electrical load 57 provided in the moving body 99, multiple the power receiving coils 41 are disposed spatially separated from one another in the movement direction of the moving body 99, and when a length of the power feeding coils 31 in the movement direction is defined as LT, a separation distance between the power feeding coils 31 is defined as DT, a length of the power receiving coils 41 in the movement direction is defined as LR, and a separation distance between the power receiving coils 41 is defined as DR, the relationship DT≤DR and the relationship (2×LR+DR)≤LT are satisfied.

According to this configuration, at least any one power receiving coil 41 directly faces a power feeding coil 31 at all times regardless of the position of the moving body 99. Accordingly, in at least one power receiving coil 41, a favorable power receiving state is ensured and a large amount of AC power can be received at all times. As a result of this, a pulsing motion of the AC power received is suppressed, and it is possible to perform stable non-contact power feeding at all times.

Furthermore, in the non-contact power feeding device 1 of the first embodiment, there is a positional relationship in which, in accordance with the movement of the moving body 99, one among multiple power receiving coils 41 directly faces one among multiple power feeding coils 31 and another among the multiple power receiving coils 41 directly faces another among the multiple power feeding coils 31. At this time, the two power receiving coils 41 are both in favorable power receiving states, a large amount of AC power is ensured.

In addition, in the non-contact power feeding device 1 of the first embodiment, there is a positional relationship in which two adjacent power receiving coils 41 each directly face a single power feeding coil 31 in accordance with movement of the moving body 99. At this time, the two power receiving coils 41 are in a favorable power receiving state in which the magnetic flux induced by a single power feeding coil 31 is shared, and a large amount of AC power is ensured.

Furthermore, the AC power supply 2 is composed of multiple AC power supplies that are provided individually for the multiple power feeding coils 31 and operate in a mutually independent manner. According to this configuration, since the individual AC power supplies 2 can be low capacity and compact, there are few restrictions on arrangement space. Furthermore, since it is possible to stop an AC power supply 2 that supplies AC power to a power feeding coil 31 that is separated from the moving body 99, the generated loss is reduced.

Furthermore, the power receiving circuit 5 is provided individually for the multiple power receiving coils 41 and includes multiple rectifier circuits 51 that convert the AC power received by the power receiving coils 41 into a DC drive voltage and output the DC drive voltage, and the output side of each of the rectifier circuits 51 is connected in parallel to the electrical load 57. According to this circuit configuration, it is possible to drive the electrical load 57 by using the AC power received by at least one of the power receiving coils 41 in a favorable power receiving state. Accordingly, a power accumulating element (battery) and a charging circuit that are used in the technique of PTL 2, and the like, are rendered unnecessary.

Furthermore, the non-contact power feeding device 1 of the first embodiment is further provided with the power receiving-side capacitor 45 and the power feeding-side capacitor 35 (resonance elements) that form a resonance circuit by being connected to the power receiving coils 41 and the power feeding coils 31. According to this configuration, a high power feeding efficiency is obtained using resonance characteristics.

Furthermore, the power receiving elements are configured as the power receiving coils 41 and the power feeding elements are configured as the power feeding coils 31. According to this configuration, stable non-contact power feeding can be performed at all times by the electromagnetic coupling type non-contact power feeding device 1.

Furthermore, the fixed section is the board production line 9 in which the multiple board production machines 91 to 93 are linearly arranged and the movement direction is set in the linear arrangement direction of the multiple board production machines 91 to 93, and the multiple power feeding coils 31 are disposed so as to have the same number as the multiple board production machines 91 to 93. According to this configuration, in all of the cases of alterations in the order of the linear arrangement positions of the first to third board production machines 91, 92, and 93, replacements with other modularized board production machines, and being made compatible with module expansion in which the number of linearly arranged machines is four or more, a favorable power receiving state is ensured in the non-contact power feeding device 1. Accordingly, when the line configuration of the board production line 9 is changed, or when the board production line 9 is made compatible with module expansion, the setup changing work for the non-contact power feeding device 1 is simple.

(4. Non-Contact Power Feeding Device 1A of Second Embodiment)

Figure 4:
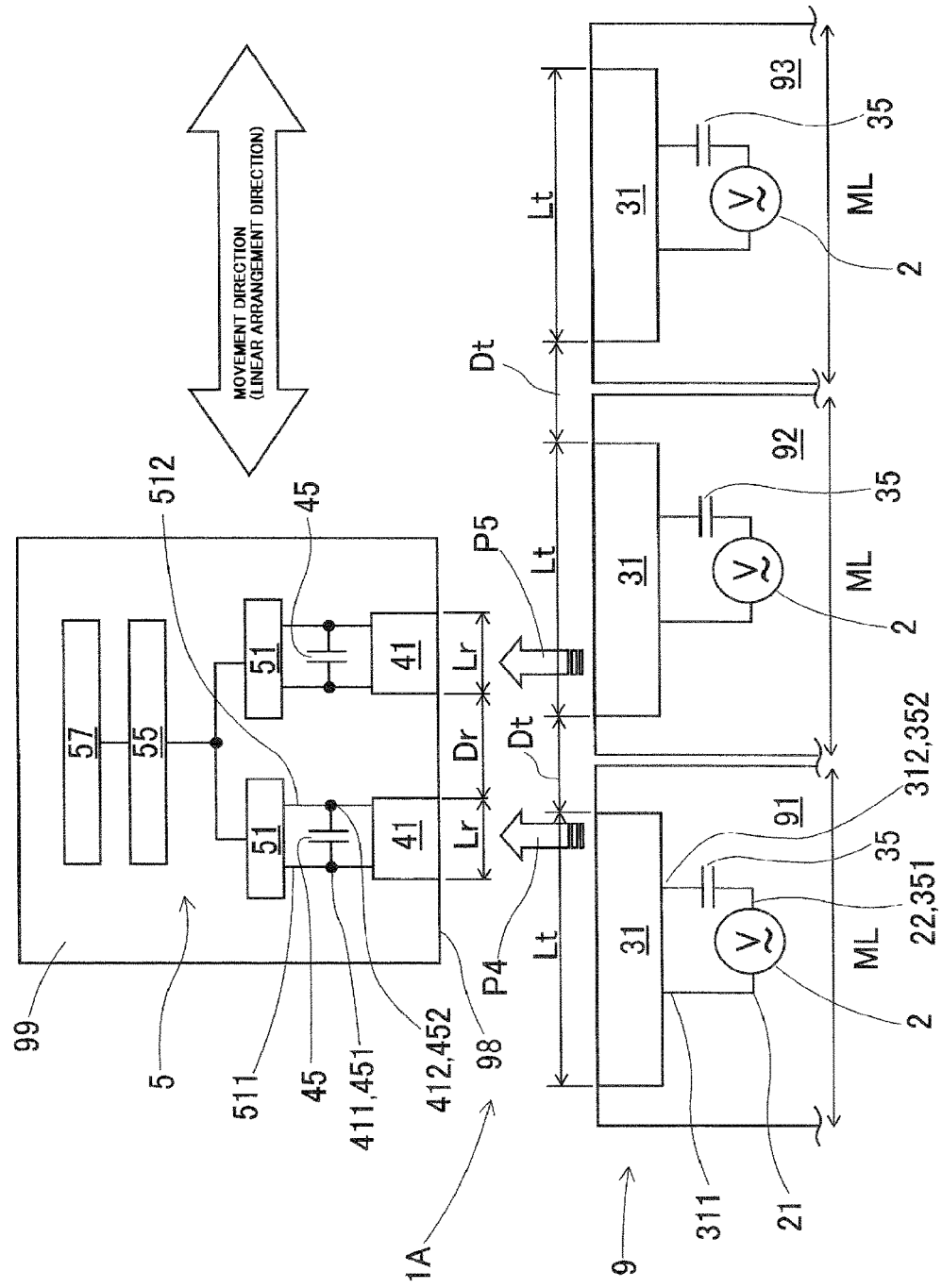
FIG. 4 is a view that schematically describes a configuration of a non-contact power feeding device of a second embodiment.

Next, a non-contact power feeding device 1A of a second embodiment will be described focusing on the differences from the first embodiment. FIG. 4 is a view that schematically describes a configuration of the non-contact power feeding device 1A of the second embodiment. The non-contact power feeding device 1A of the second embodiment has a similar configuration to that of the first embodiment, but lengths Lt and Lr of the power feeding coils 31 and the power receiving coils 41 in the movement direction and separation distances Dt and Dr between adjacent coils in the movement direction are different from the first embodiment.

As shown in FIG. 4, a length, in the movement direction, of the power feeding coils 31 on the board production line 9 side is defined as Lt, and a separation distance between power feeding coils 31 is defined as Dt. In addition, a length, in the movement direction, of the power receiving coils 41 on the moving body 99 side is defined as Lr, and a separation distance between power receiving coils 41 is defined as Dr. In this instance, the relationship Dt≤Dr is satisfied in a similar manner to the first embodiment, and a relationship (2×Lr+Dr)≤Lt is also satisfied. Accordingly, in the second embodiment, at least any one power receiving coil 41 directly faces a power feeding coil 31 at all times regardless of the position of the moving body 99.

FIG. 4 illustrates by way of example, a positional relationship in which the power receiving coil 41 on the left side in the drawing opposes the power feeding coil 31 of the first board production machine 91 and the power receiving coil 41 on the right side in the drawing directly faces the power feeding coil 31 of the second board production machine 92. In the positional relationship of FIG. 4, as shown by the arrow P4, the power receiving coil 41 on the left side receives a slightly smaller amount of AC power than a directly facing state from the power feeding coil 31 of the first board production machine 91. In addition, the power receiving coil 41 on the right side receives a large amount of AC power from the power feeding coil 31 of the second board production machine 92.

In addition, in the second embodiment, a relationship of Lr≤Dt that is different from that of the first embodiment is satisfied. In other words, the length Lr of the power receiving coils 41 in the movement direction is configured to be less than or equal to the separation distance Dt between the power feeding coils 31. In this configuration, since a straddled power receiving state of the power receiving coils 41 does not occur, it is no longer necessary to take shifts in frequency and shifts in phase between the multiple AC power supplies 2 into consideration.

The non-contact power feeding device 1A of the second embodiment is provided with the multiple power feeding coils 31 (power feeding elements) that are disposed spatially separated from one another in a movement direction set in the board production line 9 (fixed section), the AC power supplies 2 that supply AC power to each power feeding coil 31, the power receiving coils 41 (power receiving elements) that are provided in the moving body 99, which moves in the movement direction, that are electrically coupled to the power feeding coils 31 that are positioned in an opposing manner, and that receive AC power in a non-contact manner, and the power receiving circuit 5 that converts AC power received by the power receiving coils 41, and that generates a drive voltage and outputs the drive voltage to the electrical load 57 provided in the moving body 99, in which multiple the power receiving coils 41 are disposed spatially separated from one another in the movement direction of the moving body 99 so as to have a positional relationship that directly faces the power feeding coil 31 in accordance with movement of the moving body 99, and so that it is not possible to simultaneously oppose two adjacent power feeding coils 31.

According to this configuration, since a straddled power receiving state of the power receiving coils 41 does not occur, it is no longer necessary to take shifts in frequency and shifts in phase between the multiple AC power supplies 2 into consideration.

(5. Non-Contact Power Feeding Device 1B of Third Embodiment)

Next, a non-contact power feeding device 1B of a third embodiment will be described focusing on the differences from the first and second embodiments. FIG. 5 is a view that schematically describes a configuration of the non-contact power feeding device 1B of the third embodiment. The non-contact power feeding device 1B of the third embodiment is also assembled on a board production line 9B, but there is one power receiving coil 41 on the moving body 99 side. In addition, lengths LS and LC, and the like, of the power feeding coils 31 and the power receiving coil 41 in the movement direction are altered from those of the first and second embodiments. In the third embodiment, converse to the first and second embodiments, the power receiving coil 41 is longer than the power feeding coils 31.

As shown in FIG. 5, the single power receiving coil 41 is installed, in the moving body 99, on the side face 98 that opposes the power feeding coils 31. Both ends of the power receiving coil 41 are connected to a power receiving-side capacitor 45 and are connected to the input side of a rectifier circuit 51 that configures a power receiving circuit 5B. The output side of the rectifier circuit 51 is connected to a DC power supply circuit 55. Meanwhile, a total of three AC power supplies 2 that are provided in three board production machines 91, 92, and 93 are controlled so that the frequencies and phases thereof coincide in power feeding coils 31 in the vicinity of the of the moving body 99.

In this instance, the length LS, in the movement direction, of the power feeding coils 31 on the board production line 9B side is altered to be smaller than the length LT in the first embodiment. In accordance with this, a separation distance DS between the power feeding coils 31 is larger than the separation distance DT in the first embodiment. In addition, the length LC, in the movement direction, of the power receiving coil 41 on the moving body 99 side is altered to be larger than the length LR in the first embodiment.

Further, a relationship LS<LC is satisfied. According to this relationship, there is a positional relationship in which the power receiving coil 41 directly faces the power feeding coil 31, and it is possible to ensure a favorable power receiving state. In this instance, the term "directly face" signifies a positional relationship in which the entire length LS of a power feeding coil 31 in the movement direction is opposite a range of the length LR of the power receiving coil 41 in the movement direction. A broader meaning of "directly face" is that the entirety of the shorter of the power receiving coil 41 and a power feeding coil 31 is opposite a range of the larger thereof.

Furthermore, a relationship DS<LC is satisfied. According to this relationship, the power receiving coil 41 is either in a state of directly facing or opposing a power feeding coil 31, or in a straddled power receiving state of opposing at least a portion of each of two power feeding coils 31. Even in the straddled power receiving state, since the frequencies and phases of the two AC power supplies 2 that supply AC voltages to the two power feeding coils 31 are coincide, the power receiving state of the power receiving coil 41 is favorable, if the relationship DS<LC is not satisfied, there is a positional relationship in which the entire length LC of the power receiving coil 41 in the movement direction enters the separation distance DS between two power feeding coils 31. At this time, it is no longer possible for the power receiving coil 41 to interlink, with the magnetic fluxes formed by the power feeding coils 31. Accordingly, in the power receiving coil 41, the power receiving state deteriorates and the AC power received decreases significantly.

More specifically, in the positional relationship shown in FIG. 5, the power receiving coil 41 is in a straddled power receiving state of being opposite a portion of the power feeding coil 31 of the first board production machine 91 and a portion of the power feeding coil 31 of the second board production machine 92. Accordingly, as shown by the arrows P6 and P7, the power receiving coil 41 can respectively receive AC power from the two power feeding coils 31.

The non-contact power feeding device 1B of the third embodiment is provided with the multiple power feeding coils 31 (power feeding elements) that are disposed spatially separated from one another in a movement direction established in the board production line 9B (fixed section), the AC power supplies 2 that supply AC power to the power feeding coils 31 that are positioned in an opposing manner, the power receiving coil 41 (power receiving element) that is provided in the moving body 99, which moves in the movement direction, that is electrically coupled to the power feeding coils 31, and that receives AC power in a non-contact manner, and the power receiving circuit 5B that converts AC power received by the power receiving coil 41, and that generates a drive voltage and outputs the drive voltage to the electrical load 57 provided in the moving body 99, and when a length of the power feeding coils 31 in the movement direction is defined as LS, a separation distance between the power feeding coils 31 is defined as DS, and a length of the power receiving coil 41 in the movement direction is defined as LC, the relationship LS<LC and the relationship DS<LC are satisfied.

According to this configuration, since the power receiving coil 41 always opposes a portion of at least one power feeding coil 31, a pulsing motion in which the AC power received decreases significantly does not occur. Accordingly, in comparison with a case in which the secondary-side power feeding transformer moves in the region of the separation distance D in the technique of PTL 2, a favorable power receiving state is retained, and it is possible to perform stable non-contact power feeding at all times.

Furthermore, the AC power supply 2 is composed of multiple AC power supplies that are provided individually for the multiple power feeding coils 31 and are controlled so that the frequencies and phases match one another in power feeding coils 31 that are in the vicinity of the of the moving body 99. According to this configuration, it is possible to make the power receiving state of the power receiving coil 41 in a straddled power receiving state favorable. In addition, since the individual AC power supplies 2 can be low capacity and compact, there are few restrictions on arrangement space. Furthermore, since it is possible to stop an AC power supply 2 that supplies AC power to a power feeding coil 31 that is separated from the moving body 99, the generated loss is reduced.

(6. Applications and Modifications of Embodiments)

Additionally, in the first and second embodiments, it is possible to dispose two power feeding coils 31 lined up in the movement direction of the front face of each board production machine 91, 92, and 93. In this case, in the AC power supplies 2 supply an AC voltage to both ends to which two power feeding coils 31 are electrically connected in series or connected in parallel. Meanwhile, it is possible to have more than two power receiving coils 41 on the moving body 99 side. In a case in which there are three power receiving coils 41, as long as the relationships of the above-mentioned two inequalities are satisfied, at least, any one power receiving coil 41 directly faces a power feeding coil 31 at all times. Furthermore, in a case in which there are four power receiving coils 41, as long as the relationships of the above-mentioned two inequalities are satisfied, at least any two power receiving coil 41 directly face a power feeding coil 31 at all times.

Additionally, the type of the non-contact power feeding is not limited to an electromagnetic coupling type that uses the power feeding coil 31 and the power receiving coil 41, and for example, a capacitive coupling system that uses a power feeding electrode and a power receiving electrode may also be used. Various other applications and modifications are also possible in the present invention.

INDUSTRIAL APPLICABILITY

In addition to the board production lines 9 and 9B described in the embodiments, the non-contact power feeding device of the present invention can also be applied to a broad range of fields such as assembly lines and processing lines that produce other products, and power feeding during travel of an electrically driven vehicle.

REFERENCE SIGNS LIST 1, 1A, 1B: Non-contact power feeding device,
2: AC power supply,
31: Power feeding coil (power feeding element),
35: Power feeding-side capacitor,
41: Power receiving coil (power receiving element),
45: Power receiving-side capacitor,
5, 5B: Power receiving circuit,
51: Rectifier circuit,
55: DC power supply circuit,
57: Electrical load,
9, 9B: Board production line (fixed section),
91, 92, 93: First to third board production machine,
99: Moving body,
LT, Lt, LS: Length of power feeding coils in movement direction,
DT, Dt, DS: Separation distance between power feeding coils,
LR, Lr, LC: Length of power receiving coil in movement direction,
DR, Dr: Separation distance between power receiving coils

The invention claimed is:

1. A board production line comprising:
a plurality of board production machines, the board production machines being linearly arranged along a linear arrangement direction and being modularized;
a guide rail which extends in the linear arrangement direction;
a moving body movable in the linear arrangement direction along the guide rail and configured to convey equipment and members used in each of the board production machines;
a plurality of power feeding elements disposed spatially at the board production machines;
a plurality of power receiving elements disposed spatially at the moving body such that at least one of the power receiving elements always opposes a portion of at least one of the power feeding elements and receives power from the at least one of the power feeding elements; and
a driving source configured to move the moving body using the received power,
wherein, in accordance with movement the moving body, a positional relationship between the plurality of power feeding elements and the plurality of power receiving elements change sequentially from (1) to (4), where:
(1) includes (a) simultaneously with (b), where (a) a first power receiving element of the plurality of power receiving elements directly faces a first power feeding element of the plurality of power feeding elements and (b) a second power receiving element of the plurality of power receiving elements directly faces a second power feeding element of the plurality of power feeding elements,
(2) includes (c) simultaneously with (d), where (c) the first power receiving element directly faces the first power feeding element and (d) the second power receiving element opposes the second power feeding element in a state of deviating from a front face of the second power feeding element,
(3) includes (e) simultaneously with (f), where (e) the first power receiving element directly faces the first power feeding element and (f) the second power receiving element opposes the first power feeding element and the second power feeding element in a straddled manner, and
(4) includes (g) simultaneously with (h), where (g) the first power receiving element directly faces the first power feeding element and (h) the second power receiving element directly faces the first power feeding element; and
wherein the first power receiving element is disposed spatially separated from the second power receiving element at the moving body in the linear arrangement direction such that when a length of the power feeding elements in the linear arrangement direction is defined as LT, a separation distance between the power feeding elements is defined as DT, a length of the power receiving elements in the linear arrangement direction is defined as LR, and a separation distance between the power receiving elements is defined as DR, a relationship $DT \leq DR$ and a relationship $(2 \times LR + DR) \leq LT$ are satisfied.

2. The board production line according to claim 1, further comprising an AC power supply configured to supply AC power to each of the power feeding elements.

3. The board production line according to claim 2, wherein the AC power supply is composed of a plurality of AC power supplies provided individually for each of the plurality of power feeding elements and configured to operate in a mutually independent manner.

4. The board production line according to claim 2, further comprising a power receiving circuit configured to convert the AC power into a drive voltage, wherein the driving source is configured to move the moving body using the drive voltage.

5. The board production line according to claim 3, further comprising a power receiving circuit configured to convert the AC power into a drive voltage, wherein the driving source is configured to move the moving body using the drive voltage.

6. The board production line according to claim 4, wherein the power receiving circuit includes:
a plurality of rectifier circuits provided individually for each of the plurality of power receiving elements and configured to convert the AC power into DC power; and
a DC power supply circuit configured to convert the DC power into the drive voltage.

7. The board production line according to claim 5, wherein the power receiving circuit includes:
a plurality of rectifier circuits provided individually for each of the plurality of power receiving elements and configured to convert the AC power into DC power; and
a DC power supply circuit configured to convert the DC power into the drive voltage.

8. The board production line according to claim 1, further comprising a resonance element connected to at least one of the power receiving elements and the power feeding elements.

9. The board production line according to claim 6, further comprising a resonance element connected to at least one of the power receiving elements and the power feeding elements.

10. The board production line according to claim 7, further comprising a resonance element connected to at least one of the power receiving elements and the power feeding elements.

11. The board production line according to claim 1, wherein each of the power receiving elements is a power receiving coil, and each of the power feeding elements is a power feeding coil.

12. The board production line according to claim 9, wherein each of the power receiving elements is a power receiving coil, and each of the power feeding elements is a power feeding coil.

13. The board production line according to claim 10, wherein each of the power receiving elements is a power receiving coil, and each of the power feeding elements is a power feeding coil.

14. The board production line according to claim 1, wherein a total number of the power feeding elements is equal to a total number of the board production machines.

15. The board production line according to claim 12, wherein a total number of the power feeding elements is equal to a total number of the board production machines.

16. The board production line according to claim 13, wherein a total number of the power feeding elements is equal to a total number of the board production machines.

17. The board production line according to claim 1, wherein the driving source includes a linear motor.

18. The board production line according to claim 6, wherein the DC power supply circuit is a switching type or dropper type DC-DC converter.

19. The board production line according to claim 7, wherein the DC power supply circuit is a switching type or dropper type DC-DC converter.

* * * * *